US010013042B1

(12) United States Patent
Abhishek et al.

(10) Patent No.: US 10,013,042 B1
(45) Date of Patent: Jul. 3, 2018

(54) DEVICES AND METHODS FOR POWER SEQUENCE DETECTION

(71) Applicant: NXP USA, Inc., Austin, TX (US)

(72) Inventors: Kumar Abhishek, Austin, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/655,063

(22) Filed: Jul. 20, 2017

(51) Int. Cl.
G11C 5/14 (2006.01)
G06F 1/32 (2006.01)
G11C 5/04 (2006.01)
G11C 8/18 (2006.01)

(52) U.S. Cl.
CPC .......... *G06F 1/3225* (2013.01); *G06F 1/3275* (2013.01); *G11C 5/04* (2013.01); *G11C 8/18* (2013.01)

(58) Field of Classification Search
CPC ....... G06F 1/3225; G06F 1/3275; G11C 8/18; G11C 5/04
USPC ........................................................ 365/228
See application file for complete search history.

(56) References Cited

U.S. PATENT DOCUMENTS

| | | | | |
|---|---|---|---|---|
| 6,084,813 A * | 7/2000 | Kikuchi | ............. | G11C 11/4074 365/222 |
| 6,473,321 B2 * | 10/2002 | Kishimoto | ............. | G11C 16/30 327/536 |
| 7,729,193 B2 | 6/2010 | Zanders | | |
| 8,090,988 B2 * | 1/2012 | Hoang | ...................... | G06F 1/30 714/22 |
| 8,253,453 B2 | 8/2012 | Vilas Boas et al. | | |
| 8,339,632 B2 * | 12/2012 | Wasamoto | ............... | G07G 5/00 358/1.14 |

OTHER PUBLICATIONS

Silicon Labs, "EFM 32 . . . the world's most energy friendly microcontrollers, Backup Power Domain, AN0041—Application Note," http://www.silabs.com/Support%20Documents/TechnicalDocs/AN0041.pdf, May 25, 2014, 17 pages.

* cited by examiner

*Primary Examiner* — Tha-O H Bui

(57) ABSTRACT

A memory system includes a core power supply node configured to provide a core power supply; backup regulator configured to provide a backup power supply; memory configured to be powered by the core power supply or the backup power supply; threshold detection circuitry configured to provide a first indicator that when asserted indicates the core power supply has fallen to a first threshold, a second indicator that when asserted indicates the core power supply has fallen to a second threshold, and a third indicator that when asserted indicates the core power supply has fallen to a third threshold. The memory system also includes power sequence detection circuitry is configured to determine, upon the core power supply falling and based on which of the first, second, and third indicators are asserted, whether the asserted indicators have been asserted in a correct sequence and provide a first test result accordingly.

20 Claims, 5 Drawing Sheets

DEVICES AND METHODS FOR POWER SEQUENCE DETECTION

BACKGROUND

Field

This disclosure relates generally to semiconductor processing and storage systems, and more specifically, to devices and methods for power sequence detection.

Related Art

In many devices with electronic components, battery backup mode is offered wherein power is supplied by a coin cell battery when a core power supply becomes unavailable. The tripping point to switch to battery backup is decided based on comparing the falling core power supply with a bandgap threshold voltage. Several voltages typically need to be detected to determine transitions from one power mode to the next.

The bandgap threshold voltage is typically kept in the core power supply domain to save on power consumption on the coin cell battery, which can present a challenge when determining power sequence for power mode transitions. For example, the bandgap power supply may fall faster than power supply to the core due to a difference in decoupling capacitance on the printed circuit board to which the components are mounted. The tripping point is altered as the bandgap threshold voltage will be unknown before the core supply crosses the threshold. If the sequence of power levels is not correct, there is no guarantee that a required level of power will be provided to components on battery backed up domain, which can cause problems when the system recovers main power supply and expects the battery backed up components to be retaining their logic states.

If the bandgap threshold voltage is run on the always ON coin cell battery to avoid an improper sequence of voltage levels, there is a risk that the bandgap threshold voltage may not follow the common bandgap of the core power supply and there is a risk of reaching a higher or lower threshold level than the thresholds generated by the common bandgap. In some cases, the failure to generate the right thresholds from both bandgaps can cause a clock glitch at the interface to battery backed up domain components. In other cases, the battery backed up domain components may fail to isolate themselves from the power-down or power-up transitions. By not being isolated during power transition modes, components such as an SRAM device could be subject to data corruption or other undesirable conditions.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein provide a power sequence detection circuit that detects the sequence of various power modes when entering or exiting standby. Reliably detecting voltage levels during power up and power down transitions helps avoid problems that may occur when a higher or lower voltage level is detected before an intermediate level. If the sequence of power levels is not as expected, a fault indicator can be provided so that corrective action can be taken. The power sequence detection circuit can be used in any system including where components isolate themselves from the core power supply during power mode transitions.

Figure 1:
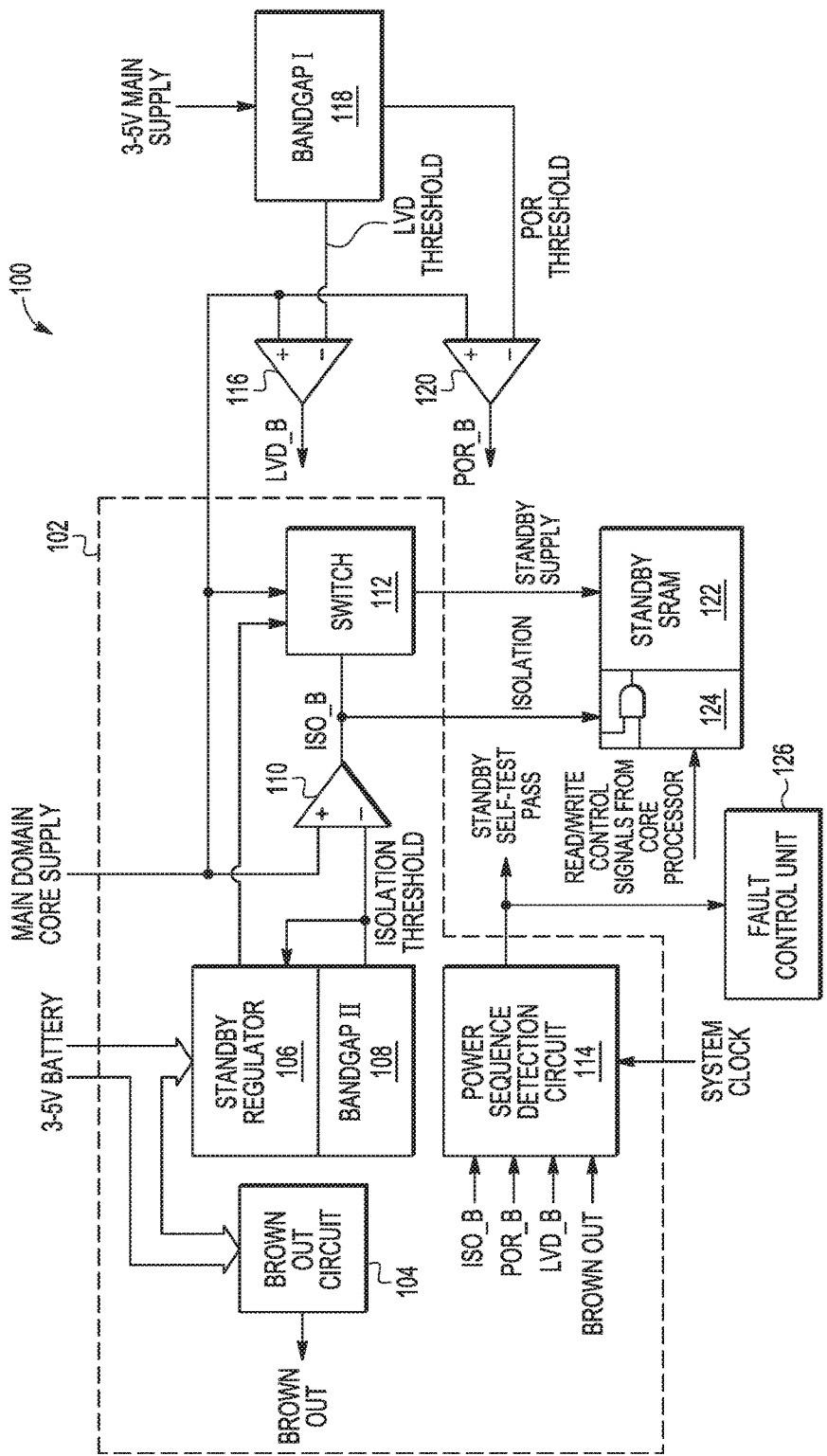
FIG. 1 is a block diagram of a voltage supply system in accordance with selected embodiments of the invention.

FIG. 1 is a block diagram of a voltage supply system 100 in accordance with selected embodiments of the invention that includes an "always on" power domain circuitry 102 with brown out circuit 104, standby or backup regulator 106, bandgap circuit 108, comparator 110, switch 112 and power sequence detection circuit 114. System 100 further includes comparator 116, bandgap circuit 118, comparator 120, standby static random access memory (SRAM) device 122, NAND gate 124, and fault control unit 126

A first power mode used in system 100 is referred to as Power On Reset (POR), is a voltage below which logic components will be non-functional. A second power mode is Low Voltage Detect (LVD), which is a voltage below which logic will not work for critical timing. A third power mode referred to as Low Voltage Isolation Standby (ISO), is a voltage below which a component such as an SRAM memory module will go into sleep/retention mode. The correct sequence of power modes during entry to standby is LVD to ISO to POR. The sequence of power levels during exit from standby is POR to ISO to LVD.

An input to bandgap circuit 118 is coupled to a core power supply and provides a constant voltage regardless of variations in the bandgap main power supply. Comparator 116 includes a non-inverting input coupled to a main domain core power supply and an inverting input coupled to an LVD threshold signal output of bandgap circuit 118. The output of comparator 116 is a complement of a low voltage detect signal (LVD_B) and is provided as input to power domain circuitry 102. Comparator 120 includes a non-inverting input coupled to the main domain core power supply and an inverting input coupled to a power on reset threshold voltage signal output by bandgap circuit 118. The output of comparator 120 is a complement of a power on reset signal (POR_B) that is provided as input to power domain circuitry 102.

Standby regulator 106 is coupled to the battery power supply and to bandgap circuit 108. Standby regulator 106 provides a battery power supply signal to an input of switch 112. Main domain core power supply is also coupled as an input to switch 112. Comparator 110 includes a non-inverting input coupled to the main domain core power supply and an inverting input coupled to an isolation threshold voltage signal output by bandgap circuit 108. The isolation threshold voltage signal is also provided as input to standby regulator 106. The output of comparator 110 is a complement of an isolation signal (ISO_B) that is provided to control operation of switch 112 such that when the power mode is in ISO, switch 112 connects battery power to SRAM device 122, and when the power mode is not ISO, switch 112 connects main domain core power supply to SRAM device 122.

The ISO_B signal is also provided as input to AND gate 124. A second input of AND gate 124 is coupled to read/write control signals from one or more processing cores. The output of AND gate 124 is coupled to SRAM device 122 to control whether SRAM device 122 is placed in isolation from the main domain core supply.

Power sequence detection circuit 114 receives the complement of the ISO, POR and LVD signals, shown as ISO_B, POR_B, and LVD_B, along with a brown out signal and system clock signal. Power sequence detection circuit 114 combines the ISO_B, POR_B, and LVD_B signals to generate a standby self-test pass signal indicating whether the power down or power up sequence occurred in the correct order. Fault control unit 126 receives the standby self-test pass signal from power sequence detection circuit 114 and can be configured to send warning notices to core processors if the correct sequence was not detected to take corrective action, or other suitable notices/warnings to other components and/or system operators.

Figure 2:
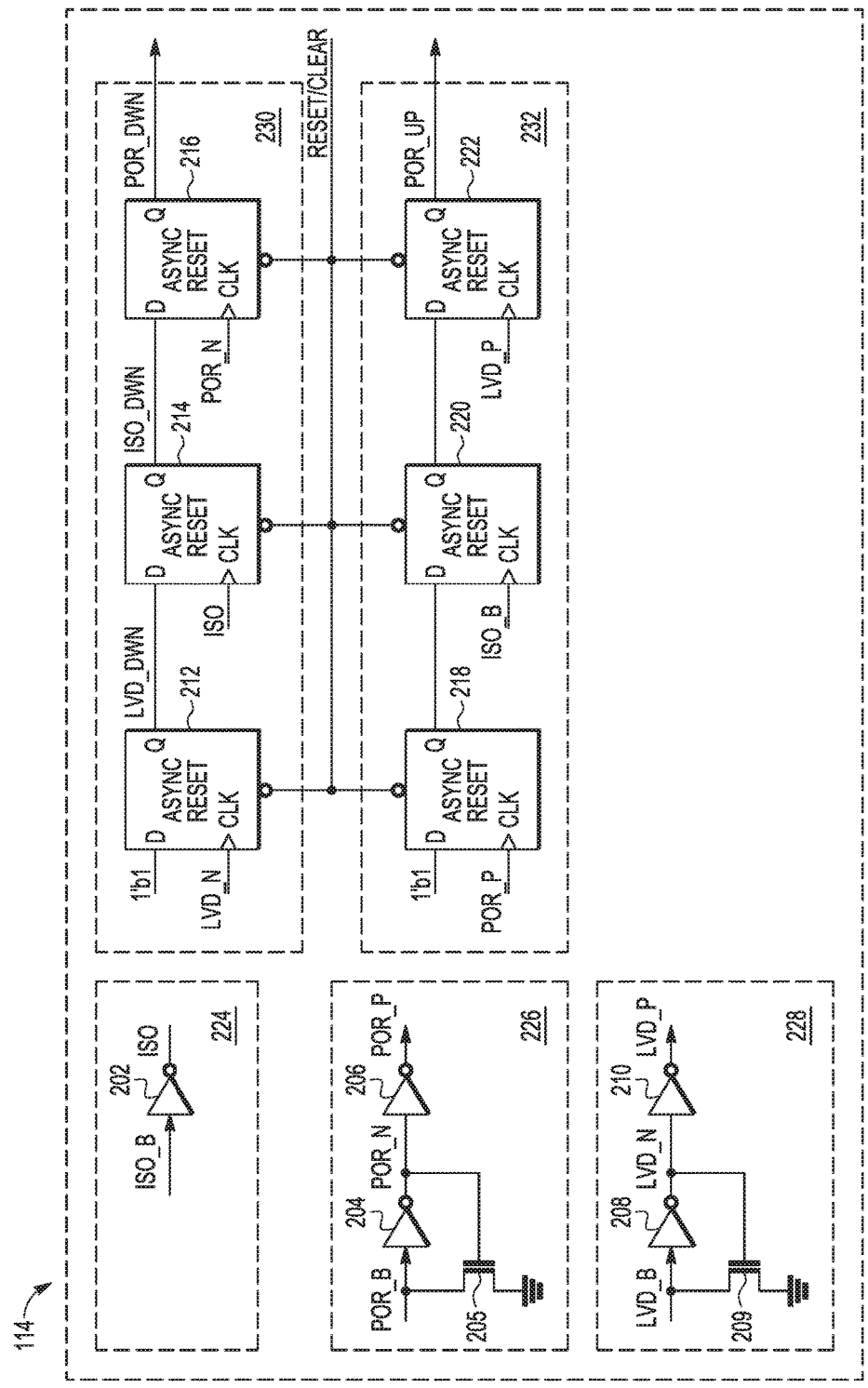
FIG. 2 is a schematic diagram of an embodiment of a first portion of a power sequence detection circuit that can be used in the voltage supply system of FIG. 1.

FIG. 2 is a schematic diagram of an embodiment of a first portion of power sequence detection circuit 114 that can be used in the voltage supply system 100 of FIG. 1. The portion of power sequence detection circuit 114 shown includes inverters 202-210, pull-down N type transistors 205, 209, and asynchronous reset flip flop circuits 212, 214, 216, 218, 220, 222.

Isolation signal circuit 224 includes inverter 202 with an input coupled to the ISO_B signal and an output that provides an ISO signal, which is the inverse or complement of the ISO_B signal.

Power on reset signal circuit 226 includes inverters 204, 206. An input to inverter 204 is coupled to the POR_B signal, and an output of inverter 204 is a negative power-on reset signal POR_N, which indicates a power on reset condition when asserted or "high". The POR_N signal is coupled to a control gate electrode of transistor 205 and an input of inverter 206. When the POR_B signal is low, the POR_N signal is high, which places transistor 205 in conductive mode. Since the source electrode of transistor 205 is coupled to ground, the state of the POR_B signal is reinforced to low. An output of inverter 206 is a positive power on reset signal POR_P, which is the complement of the POR_N signal. When the POR_B signal is high, the POR_N signal is low and transistor 205 is in non-conductive mode. The POR_P signal will then be high when the POR_N signal is low.

Low voltage detect signal circuit 228 includes inverters 208, 210. An input to inverter 208 is coupled to the LVD_B signal, and an output of inverter 208 is a negative power-on reset signal LVD_N, which indicates a low voltage detect condition when asserted or "high". The LVD_N signal is coupled to a control gate electrode of transistor 209 and an input of inverter 210. When the LVD_B signal is low, the LVD_N signal is high, which places transistor 209 in conductive mode. Since the source electrode of transistor 209 is coupled to ground, the state of the LVD_B signal is reinforced to low. An output of inverter 210 is a positive low voltage detect signal LVD_P, which is the complement of the LVD_N signal. When the LVD_B signal is high, the LVD_N signal is low and transistor 205 is in non-conductive mode. The LVD_P signal will then be high when the LVD_N signal is low.

Low power entry sequence detection circuit 230 detects proper entry into a low or standby power mode includes flip flop circuits 212-216. Flip flop circuit 212 includes a data input coupled to a data "1" bit, a clock input coupled to the LVD_N signal and an output that provides a LVD_DWN signal, which indicates whether a threshold LVD voltage level has been reached. Flip flop circuit 214 includes a data input coupled to the LVD_DWN signal, a clock input coupled to the ISO signal and an output that provides an ISO_DWN signal, which indicates whether a threshold ISO voltage level has been reached after the LVD_DWN signal was asserted. Flip flop circuit 216 includes a data input coupled to the ISO_DWN signal, a clock input coupled to the POR_N signal and an output that provides a POR_DWN signal, which indicates whether a threshold POR voltage level has been reached after the LVD_N and ISO signals were asserted in order, which is the correct sequence for entering the low or standby power mode.

Low power exit sequence detection circuit 232 detects proper exit from a low or standby power mode includes flip flop circuits 218-222. Flip flop circuit 218 includes a data input coupled to a data "1" bit, a clock input coupled to the POR-P signal and an output that is coupled to the data input of flip flop circuit 220. The output of flip flop circuit 218 indicates whether a threshold POR voltage level has been reached. Flip flop circuit 220 further includes a clock input coupled to the ISO_B signal and an output that is coupled to an input of flip flop circuit 222. The output of flip flop circuit 220 indicates whether a threshold ISO voltage level has been reached after the POR_P signal was asserted. Flip flop circuit 222 further includes a clock input coupled to the LVD_P signal and an output that provides a POR_UP signal, which indicates whether a threshold LVD voltage level has been reached after the POR_P and ISO_B signals were asserted in order, which is the correct sequence for exiting the low or standby power mode.

When entry into or exit from a low or standby power mode is complete, whether the sequence was correct or not, a clear or reset signal can be asserted to reset the output of flip flop circuits 212-222 to low. The reset/clear signal can be asserted on power up from a stand-by mode before power sequence detection circuit 114 begins operation, for example.

Figure 3:
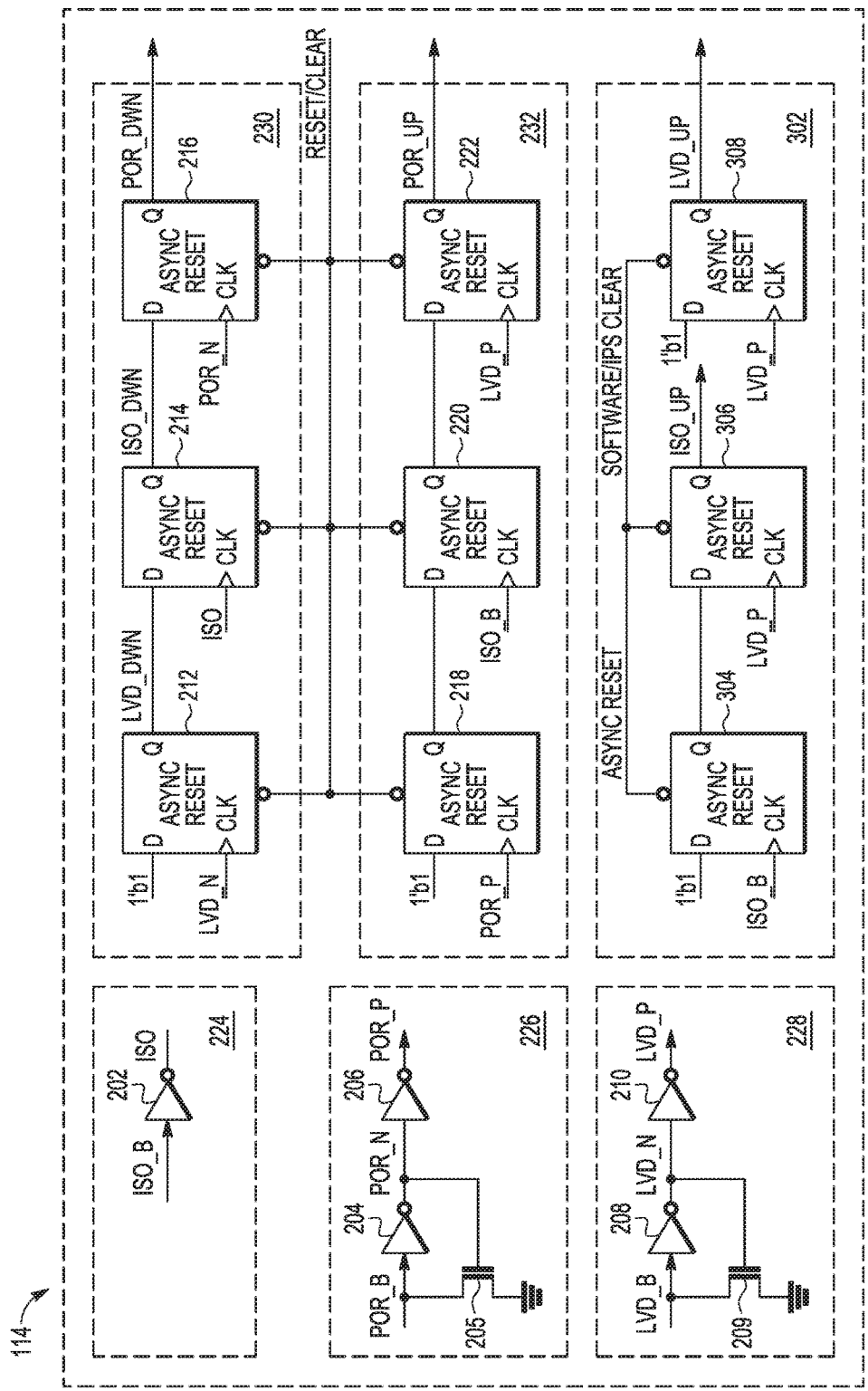
FIG. 3 is a schematic diagram of the first portion of the power sequence detection circuit of FIG. 2 showing components used in a monitoring sequence when a core power supply is only partially removed.

FIG. 3 is a schematic diagram of another portion of the power sequence detection circuit 114 of FIG. 1 showing components used in a monitoring sequence when a core power supply is only partially removed. Similar to power sequence detection circuit 114 of FIG. 2, FIG. 3 includes isolation signal circuit 224, power on reset signal circuit 226, low voltage detect signal circuit 228, low power entry sequence detection circuit 230, and low power exit sequence detection circuit 232, which operate as described herein for FIG. 2.

Power sequence detection circuit 114 further includes standby abort detection circuit 302 that includes asynchronous reset flip flop circuits 304, 306, 308 to set signals that can be used to detect where entry and exit to standby mode is aborted before a complete power down of the main core supply. Flip flop circuit 304 includes a data input coupled to a data "1" bit, a clock input coupled to the ISO_B signal and an output that is coupled to the data input of flip flop circuit 306. The output of flip flop circuit 304 indicates whether a threshold ISO voltage level has been reached. Flip flop circuit 306 further includes a clock input coupled to the LVD_P signal and an output that indicates whether the ISO_UP signal is asserted. The output of flip flop circuit is an ISO_UP signal that indicates whether the isolation threshold has been reached during exit from standby. Flip flop circuit 308 includes a data input coupled to a data "1" bit, a clock input coupled to the LVD_P signal and an output that provides an LVD_UP signal, which indicates whether a threshold LVD voltage level has been reached during exit from standby power mode. The combination of the POR_DWN, LVD_DWN, POR_UP, LVD_UP, ISO_DWN and ISO_UP signals can be used to determine the level the core power reached, as further described for FIG. 5. As an example, if the core power supply is below the LVD threshold level but above the ISO and POR threshold levels, the LVD_DWN and LVD_UP signals are asserted, but POR_DWN, POR_UP, ISO_DWN, and ISO_UP signals will not be asserted.

Figure 4:
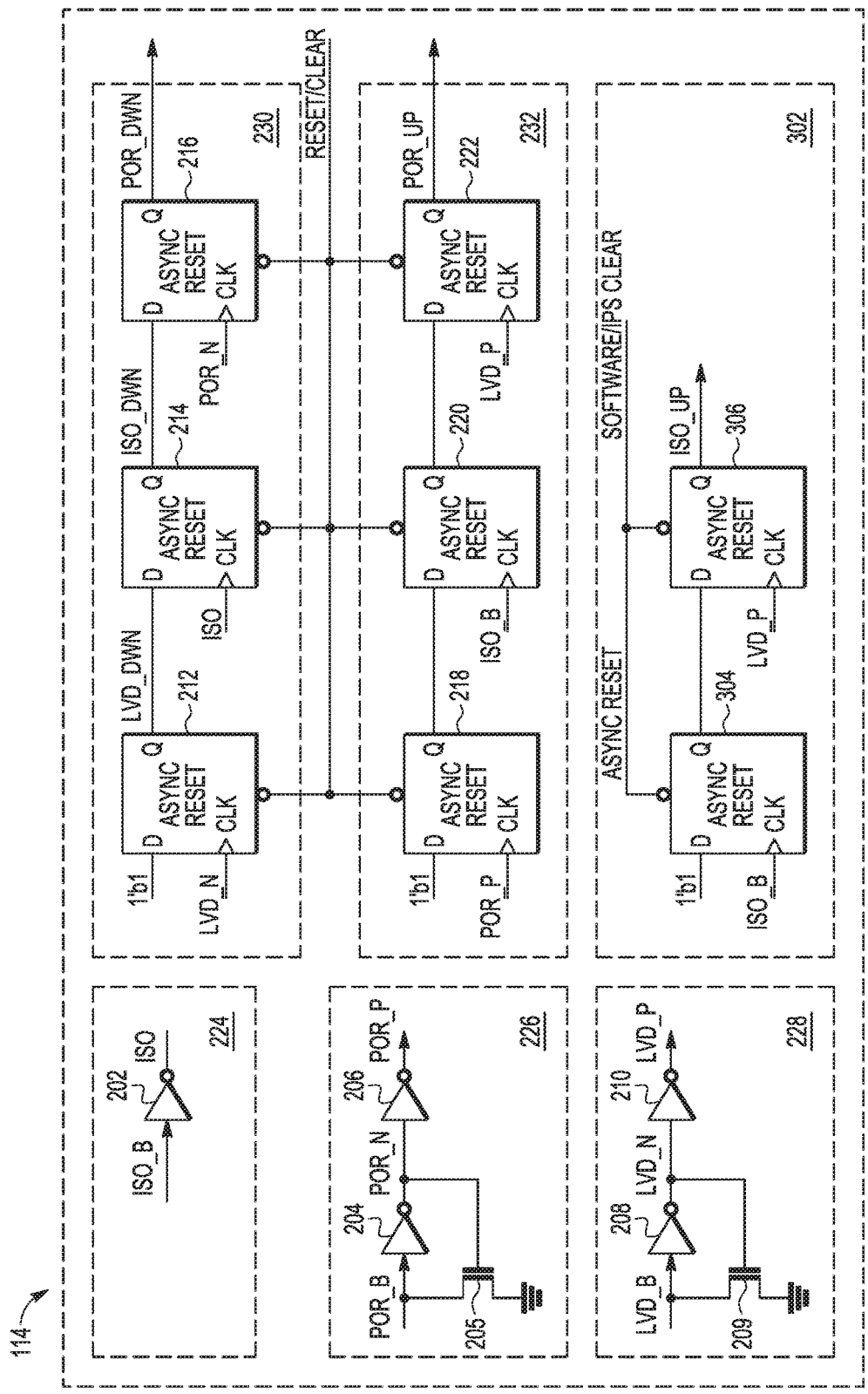
FIG. 4 is a schematic diagram of the first portion of the power sequence detection circuit of FIG. 2 showing components used in a monitoring sequence when the core power supply is only partially removed.

FIG. 4 is a schematic diagram of another portion of the power sequence detection circuit 114 of FIG. 1 showing components used in a monitoring sequence when a core power supply is only partially removed to a level that is below LVD and ISO threshold levels, but above the POR threshold level. Similar to power sequence detection circuit 114 of FIG. 3, FIG. 4 includes isolation signal circuit 224, power on reset signal circuit 226, low voltage detect signal circuit 228, low power entry sequence detection circuit 230, and low power exit sequence detection circuit 232, which operate as described herein for FIG. 2.

Power sequence detection circuit 114 further includes standby abort detection circuit 302 that includes asynchronous reset flip flop circuits 304, 306 to set signals than can be used to detect where exit from a low or standby power mode is aborted. Flip flop circuit 304 includes a data input coupled to a data "1" bit, a clock input coupled to the ISO_B signal and an output that is coupled to the data input of flip flop circuit 306. The output of flip flop circuit 304 indicates whether a threshold ISO voltage level has been reached. Flip flop circuit 306 further includes a clock input coupled to the LVD_P signal and an output that indicates whether the ISO_UP signal is asserted. The output of flip flop circuit is an ISO_UP signal that indicates whether the isolation mode threshold has been reached during exit from standby. The combination of the POR_DWN, LVD_DWN, POR_UP, LVD_UP, ISO_DWN and ISO_UP signals can be used to determine the level the core power reached, as further described for FIG. 5. As an example, if the core power supply is below the LVD and ISO threshold levels but above the POR threshold level, the LVD_DWN, LVD_UP, ISO_DWN, and ISO_UP signals are asserted, but POR_DWN, POR_UP, signals will not be asserted.

Figure 5:
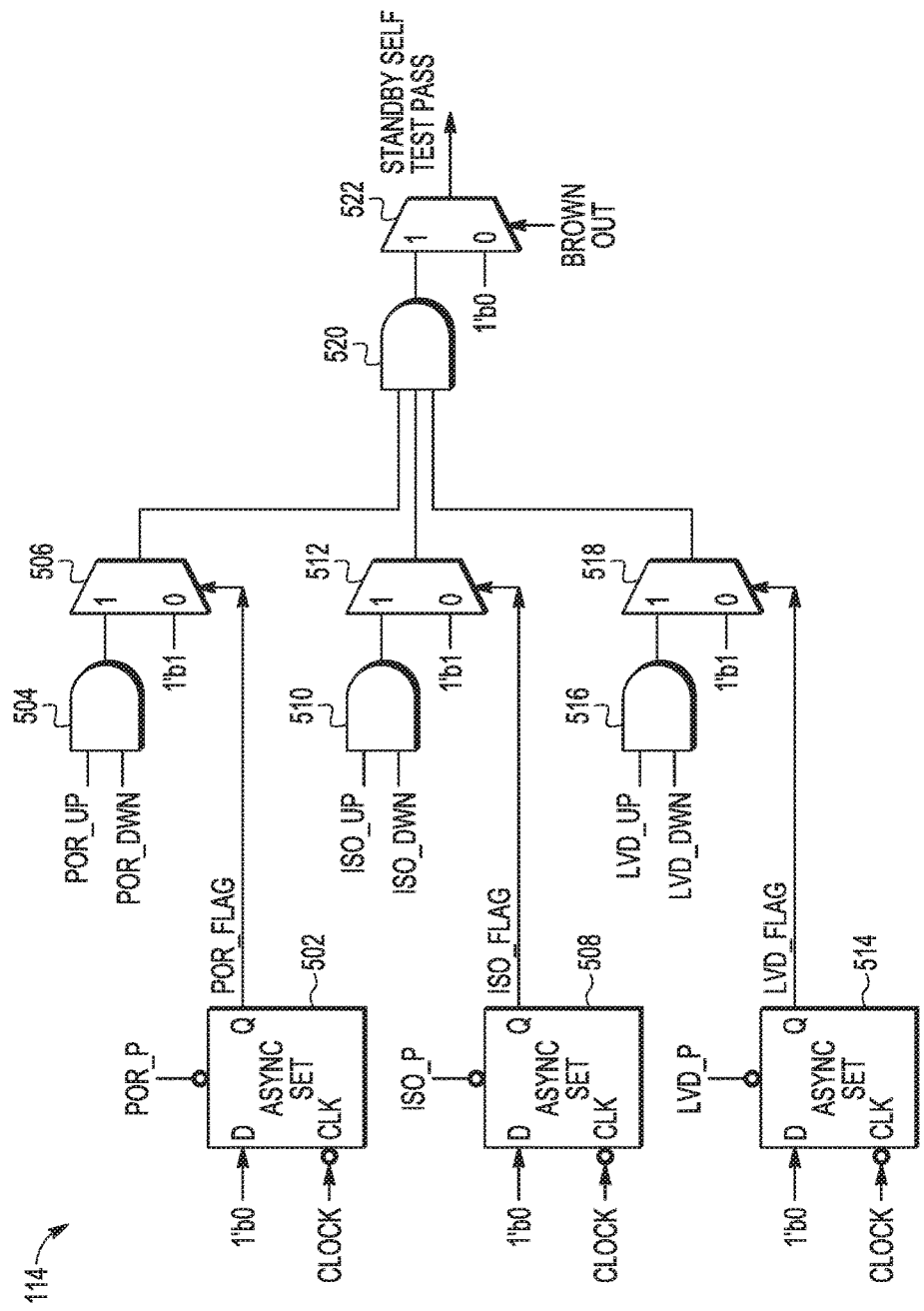
FIG. 5 is a schematic diagram of an embodiment of another portion of the power sequence detection circuit of FIG. 1 to indicate the result of monitoring power down/power up sequences using the power supply detection circuits of FIGS. 2, 3 and 4.

FIG. 5 is a schematic diagram of an embodiment of another portion of the power sequence detection circuit 114 of FIG. 1 that is used to indicate the result of monitoring power down/power up sequences using the power supply detection circuits of FIGS. 2, 3 and 4. In addition to the components shown in FIGS. 2, 3 and 4, power supply detection circuit 114 can further include asynchronous set flip flop circuits 502, 508, 514, AND gates 504, 510, 516, 520, and multiplexers 506, 512, 518, 522. Flip flop circuit 502 includes a data input coupled to a data "1" bit, a clock input coupled to a clock signal and an output that couples a POR_FLAG signal to a control input of POR multiplexer 506. The reset control of flip flop circuit 502 is coupled to the POR_P signal. When the POR_P signal is de-asserted, flip flop circuit 502 asserts the POR_FLAG signal, which indicates that the main core supply ramped down below POR voltage level threshold. AND gate 504 includes a first input coupled to the POR_UP signal and a second input coupled to the POR_DWN signal. POR multiplexer 506 includes a first input coupled to an output of AND gate 504 and a second input coupled to a data "1" bit. When both the POR_UP and POR_DWN signals are asserted, and the POR_FLAG signal is asserted, the output of POR multiplexer 506 is "HIGH". If one or the other of the POR_UP and POR_DWN signals are not asserted, and the POR_FLAG signal is asserted, the output of POR multiplexer 506 is "LOW". If the POR_FLAG signal is not asserted, which indicates that the main core power supply did not ramp down below POR voltage threshold, the output of POR multiplexer 506 is "HIGH" and the POR_UP and POR_DWN signals are ignored by the multiplexer 506.

Flip flop circuit 508 includes a data input coupled to a data "1" bit, a clock input coupled to a clock signal and an output that couples a ISO_FLAG signal to a control input of ISO multiplexer 512. The reset control of flip flop circuit 508 is coupled to the ISO_P signal. When the ISO_P signal is de-asserted, flip flop circuit 508 asserts the ISO_FLAG signal, which indicates the main core supply ramped down below ISO voltage threshold AND gate 510 includes a first input coupled to the ISO_UP signal and a second input coupled to the ISO_DWN signal. ISO multiplexer 512 includes a first input coupled to an output of AND gate 510 and a second input coupled to a data "1" bit. When both the ISO_UP and ISO_DWN signals are asserted, and the ISO_FLAG signal is asserted, the output of ISO multiplexer 512 is "HIGH". If one or the other of the ISO_UP and ISO_DWN signals are not asserted, and the ISO_FLAG signal is asserted, the output of ISO multiplexer 512 is "LOW". If the ISO_FLAG signal is not asserted, which indicates the main core power supply did not ramp down below ISO voltage threshold, the output of ISO multiplexer 512 is "HIGH" and the ISO_UP and ISO_DWN signals are ignored by multiplexer 512.

Flip flop circuit 514 includes a data input coupled to a data "1" bit, a clock input coupled to a clock signal and an output that couples a LVD_FLAG signal to a control input of LVD multiplexer 518. The reset control of flip flop circuit 514 is coupled to the LVD_P signal. When the LVD_P signal is de-asserted, flip flop circuit 514 asserts the LVD_FLAG signal. This indicates main core supply ramped down below LVD voltage threshold. AND gate 504 includes a first input coupled to the LVD_UP signal and a second input coupled to the LVD_DWN signal. LVD multiplexer 518 includes a first input coupled to an output of AND gate 516 and a second input coupled to a data "1" bit. When both the LVD_UP and LVD_DWN signals are asserted, and the LVD_FLAG signal is asserted, the output of LVD multiplexer 518 is "HIGH". If one or the other of the LVD_UP and LVD_DWN signals are not asserted, and the LVD_FLAG signal is asserted, the output of LVD multiplexer 518 is "LOW". If the LVD_FLAG signal is not asserted, which indicates the main core supply did not ramp down to the LVD voltage threshold, the output of LVD multiplexer 518 is "HIGH" and the LVD_UP and LVD_DWN signals are ignored by multiplexer 518.

AND gate 520 includes a first input coupled to the output of POR multiplexer 506, a second input coupled to the output of ISO multiplexer 512 and a third input coupled to the output of LVD multiplexer 518. Pass/Fail multiplexer 522 includes a first input coupled to the output of AND gate 520 and a second input coupled to a data "1" bit. A control input of Pass/Fail multiplexer 522 is coupled to a brownout signal, which is asserted whenever the battery backup power supply voltage level drops below a nominal value. If the main core supply ramps down with the correct sequence of POR, ISO and LVD voltage indicators, then the output of the AND gate 520 is "HIGH". A brownout circuit detects if the battery power supply level is reliable. If the brownout signal is not asserted, it indicates the battery power supply is good and the multiplexer 522 outputs a "HIGH" indicating a self-test pass. If the brownout signal is asserted, then the standby regulator (battery backup power supply) can be unreliable, causing the status of the AND gate 520 to be ignored and AND gate 522 to output a low indicating a FAIL. If the sequence of POR, ISO and LVD voltage indicators is incorrect during standby entry or standby exit, AND gate 520 outputs a LOW and the output of multiplexer 522 generates a LOW indicating a FAIL. The FAIL state can be read by a fault controller when main core supply returns to determine that the standby entry-exit has not happened reliably. With the FAIL indication, logic in system 100 may conclude the always ON domain components like SRAM cannot be relied upon and appropriate care can be taken by the system By now it should be appreciated that in selected embodiments there has been provided a memory system (100) that can include a core power supply node configured to provide a core power supply, a backup regulator (106) configured to provide a backup power supply, and a memory (124/122) configured to be powered by the core power supply or the backup power supply. Threshold detection circuitry (110, 116, 120) can be configured to provide: a first indicator (POR_B) that when asserted indicates the core power supply has fallen to a first threshold, a second indicator (LVD_B) that when asserted indicates the core power supply has fallen to a second threshold, a third indicator (ISO_B) that when asserted indicates the core power supply has fallen to a third threshold. Power sequence detection circuitry (114) can be configured to determine, upon the core power supply falling and based on which of the first, second, and third indicators are asserted, whether the asserted indicators have been asserted in a correct sequence and provide a first test result (POR_DOWN, ISO_ DOWN, or LVD_ DOWN) accordingly.

In another aspect, the first threshold can represent a voltage level below which logic will be non-functional, the second threshold can represent a voltage level below which logic will not meet critical timing requirements, and the third threshold can represent a voltage level below which the memory enters standby mode and is powered by the backup power supply rather than the core power supply. The third threshold can be between the first and second thresholds.

In another aspect, in response to assertion of the third indicator, the memory can be configured to be isolated from its control input circuitry for read/write access and the memory can be configured to be powered by the backup power supply instead of the core power supply.

In another aspect, when the core power supply falls to the first threshold and each of the first, second, and third indicators is asserted, the first test result indicates a correct sequence when the second indicator is asserted first, followed by assertion of the third indicator, and then followed by assertion of the first indicator and indicates an incorrect sequence otherwise.

In another aspect, when the core power supply falls to the third threshold and each of the second and third indicators are asserted but not the first indicator, the first test result indicates a correct sequence when the second indicator is asserted first followed by assertion of the third indicator and indicates an incorrect sequence otherwise.

In another aspect, when the core power supply falls to the second threshold and the second indicator is asserted but not the first and third indicators, the first test result indicates a correct sequence and indicates an incorrect sequence otherwise.

In another aspect, the power sequence detection circuitry can comprise a first flip flop (212) clocked in response to assertion of the second indicator, a second flip flop (214) clocked in response to assertion of the third indicator, and a third flip flop (216) clocked In response to assertion of the first indicator. A predetermined value input at the first flip flop can be propagated from the first flip flop, through the second flip flop, to an output of the third flip flop only when the second indicator is asserted first, followed by assertion of the third indicator, and then assertion of the first indicator.

In another aspect, the memory system can further comprise a first inverter (202) having an input coupled to receive the third indicator and an output coupled to a clock input of the second flip flop (214), a second inverter (204) having an input coupled to receive the first indicator and an output coupled to a clock input of the third flip flop (216), and a third inverter (208) having an input coupled to receive the second indicator and an output coupled to a clock input of the first flip flop (212).

In another aspect, the first indicator and second indicator can be generated within a power domain powered by the main core power supply, and the third indicator can be generated within an always-on power domain (102).

In another aspect, the first, second, and third flip flops and the first, second, and third inverters can be in the always-on power domain.

In another aspect, the first test result can be provided when a brown-out condition is not indicated.

In another aspect, the power sequence detection circuit is configured to determine, upon the core power supply rising and based on which of the first, second, and third indicators are negated, whether the negated indicators have been negated in a correct sequence and provide a second test result (POR_UP, ISO_UP, or LVD_UP) accordingly.

In another aspect, when the core power supply rises to the first threshold and each of the first, second, and third indicators is negated, the second test result indicates a correct sequence when the first indicator is negation first, followed by negation of the third indicator, and then followed by negation of the second indicator and indicates an incorrect sequence otherwise.

In another aspect, the power sequence detection circuitry can comprise a first flip flop (218) clocked in response to negation of the first indicator, a second flip flop (220) clocked in response to negation of the third indicator, and a third flip flop (222) clocked in response to negation of the second indicator. A predetermined value input at the first flip flop can be propagated from the first flip flop, through the second flip flop, to an output of the third flip flop only when the first indicator is negation first, followed by negation of the third indicator, and then negation of the second indicator.

In other selected embodiments, a memory system can comprise a core power supply node configured to provide a core power supply, backup regulator configured to provide a backup power supply, and a memory (124/122) configured to be powered by the core power supply or the backup power supply. Threshold detection circuitry can be configured to provide a first indicator (POR_B) that when asserted indicates the core power supply has fallen to a first threshold and when negated indicates the core power supply has risen above the first threshold, a second indicator (LVD_B) that when asserted indicates the core power supply has fallen to a second threshold and when negated indicates the core power supply has risen above the second threshold, a third indicator (ISO_B) that when asserted indicates the core power supply has fallen to a third threshold and when negated indicates the core power supply has risen above the third threshold. Power sequence detection circuitry can include a first flip flop clocked in response to assertion of the second indicator and having a data input coupled to receive a predetermined value, a second flip flop clocked in response to assertion of the third indicator and having a data input coupled to a data output of the first flip flop, and a third flip flop clocked in response to assertion of the first indicator and having a data input coupled to a data output of the second flip flop and a data output configured to provide a first test result indicating whether the first, second, and third indicators were asserted in correct sequence.

In another aspect, the power sequence detection circuitry can further comprise a fourth flip flop (218) clocked in response to negation of the first indicator and having a data input coupled to receive the predetermined value, a fifth flip flop (220) clocked in response to negation of the third indicator and having a data input coupled to a data output of the fourth flip flop, and a sixth flip flop (222) clocked In response to negation of the second indicator and having a data input coupled to a data output of the fifth flip flop and a data output configured to provide a second test result indicating whether the first, second, and third indicators were negated in correct sequence.

In another aspect, the memory system can further comprise a first inverter (202) having an input coupled to receive the third indicator and an output coupled to a clock input of the second flip flop, a second inverter (204) having an input coupled to receive the first indicator and an output coupled to a clock input of the third flip flop, and a third inverter (208) having an input coupled to receive the second indicator and an output coupled to a clock input of the first flip flop. A fourth inverter (206) can have an input coupled to the output of the second inverter and an output coupled to a clock input of the fourth flip flop. A fifth inverter (210) can have an input coupled to the output of the third inverter and an output coupled to a clock input of the sixth flip flop.

In another aspect, in response to assertion of the third indicator, the memory can be configured to be isolated from its control input circuitry for read/write access and the memory is configured to be powered by the backup power supply instead of the core power supply.

In another aspect, the first threshold can represent a voltage level below which logic will be non-functional, the second threshold can represent a voltage level below which logic will not meet critical timing requirements, and the third threshold can represent a voltage level below which the memory enters standby mode and is powered by the backup power supply rather than the core power supply. The third threshold can be between the first and second thresholds.

In another aspect, the power sequence detection circuitry can be configured to provide a standby test result based on the first test result, the second test result, and a brown out indicator. The first test result and the second test result can be used only when a brown out is not detected in an always-on domain, and the standby test result indicates fail when a brown out is detected in the always-on domain.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising:
  a core power supply node configured to provide a core power supply;
  a backup regulator configured to provide a backup power supply;
  a memory configured to be powered by the core power supply or the backup power supply;
  threshold detection circuitry configured to provide:
    a first indicator that when asserted indicates the core power supply has fallen to a first threshold,
    a second indicator that when asserted indicates the core power supply has fallen to a second threshold,
    a third indicator that when asserted indicates the core power supply has fallen to a third threshold; and
  power sequence detection circuitry configured to determine, upon the core power supply falling and based on which of the first, second, and third indicators are asserted, whether the asserted indicators have been asserted in a correct sequence and provide a first test result accordingly.

2. The memory system of claim 1, wherein the first threshold represents a voltage level below which logic will be non-functional, the second threshold represents a voltage level below which logic will not meet critical timing requirements, and the third threshold represents a voltage level below which the memory enters standby mode and is powered by the backup power supply rather than the core power supply, and wherein the third threshold is between the first and second thresholds.

3. The memory system of claim 1, wherein, in response to assertion of the third indicator, the memory is configured to be isolated from its control input circuitry for read/write access and the memory is configured to be powered by the backup power supply instead of the core power supply.

4. The memory system of claim 1, wherein when the core power supply falls to the first threshold and each of the first, second, and third indicators is asserted, the first test result indicates a correct sequence when the second indicator is asserted first, followed by assertion of the third indicator, and then followed by assertion of the first indicator and indicates an incorrect sequence otherwise.

5. The memory system of claim 4, wherein when the core power supply falls to the third threshold and each of the second and third indicators are asserted but not the first indicator, the first test result indicates a correct sequence when the second indicator is asserted first followed by assertion of the third indicator and indicates an incorrect sequence otherwise.

6. The memory system of claim 5, wherein when the core power supply falls to the second threshold and the second indicator is asserted but not the first and third indicators, the first test result indicates a correct sequence and indicates an incorrect sequence otherwise.

7. The memory system of claim 1, wherein the power sequence detection circuitry comprises:
a first flip flop clocked in response to assertion of the second indicator;
a second flip flop clocked in response to assertion of the third indicator; and
a third flip flop clocked In response to assertion of the first indicator, wherein a predetermined value input at the first flip flop is propagated from the first flip flop, through the second flip flop, to an output of the third flip flop only when the second indicator is asserted first, followed by assertion of the third indicator, and then assertion of the first indicator.

8. The memory system of claim 7, further comprising:
a first inverter having an input coupled to receive the third indicator and an output coupled to a clock input of the second flip flop;
a second inverter having an input coupled to receive the first indicator and an output coupled to a clock input of the third flip flop; and
a third inverter having an input coupled to receive the second indicator and an output coupled to a clock input of the first flip flop.

9. The memory system of claim 8, wherein the first indicator and second indicator are generated within a power domain powered by the core power supply, and the third indicator is generated within an always-on power domain.

10. The memory system of claim 9, wherein the first, second, and third flip flops and the first, second, and third inverters are in the always-on power domain.

11. The memory system of claim 1, wherein the first test result is provided when a brown-out condition is not indicated.

12. The memory system of claim 1, wherein the power sequence detection circuit is configured to determine, upon the core power supply rising and based on which of the first, second, and third indicators are negated, whether the negated indicators have been negated in a correct sequence and provide a second test result accordingly.

13. The memory system of claim 12, wherein when the core power supply rises to the first threshold and each of the first, second, and third indicators is negated, the second test result indicates a correct sequence when the first indicator is negation first, followed by negation of the third indicator, and then followed by negation of the second indicator and indicates an incorrect sequence otherwise.

14. The memory system of claim 13, wherein the power sequence detection circuitry comprises:
a first flip flop clocked in response to negation of the first indicator;
a second flip flop clocked in response to negation of the third indicator; and
a third flip flop clocked in response to negation of the second indicator, wherein a predetermined value input at the first flip flop is propagated from the first flip flop, through the second flip flop, to an output of the third flip flop only when the first indicator is negation first, followed by negation of the third indicator, and then negation of the second indicator.

15. A memory system, comprising:
a core power supply node configured to provide a core power supply;
backup regulator configured to provide a backup power supply;
a memory configured to be powered by the core power supply or the backup power supply;
threshold detection circuitry configured to provide:
a first indicator that when asserted indicates the core power supply has fallen to a first threshold and when negated indicates the core power supply has risen above the first threshold,
a second indicator that when asserted indicates the core power supply has fallen to a second threshold and when negated indicates the core power supply has risen above the second threshold,
a third indicator that when asserted indicates the core power supply has fallen to a third threshold and when negated indicates the core power supply has risen above the third threshold; and
power sequence detection circuitry comprising:
a first flip flop clocked in response to assertion of the second indicator and having a data input coupled to receive a predetermined value;
a second flip flop clocked in response to assertion of the third indicator and having a data input coupled to a data output of the first flip flop; and
a third flip flop clocked in response to assertion of the first indicator and having a data input coupled to a data output of the second flip flop and a data output configured to provide a first test result indicating whether the first, second, and third indicators were asserted in correct sequence.

16. The memory system of claim 15, wherein the power sequence detection circuitry further comprises:
a fourth flip flop clocked in response to negation of the first indicator and having a data input coupled to receive the predetermined value;
a fifth flip flop clocked in response to negation of the third indicator and having a data input coupled to a data output of the fourth flip flop; and
a sixth flip flop clocked in response to negation of the second indicator and having a data input coupled to a data output of the fifth flip flop and a data output configured to provide a second test result indicating whether the first, second, and third indicators were negated in correct sequence.

17. The memory system of claim 16, further comprising:
a first inverter having an input coupled to receive the third indicator and an output coupled to a clock input of the second flip flop;
a second inverter having an input coupled to receive the first indicator and an output coupled to a clock input of the third flip flop; and
a third inverter having an input coupled to receive the second indicator and an output coupled to a clock input of the first flip flop;
a fourth inverter having an input coupled to the output of the second inverter and an output coupled to a clock input of the fourth flip flop;
a fifth inverter having an input coupled to the output of the third inverter and an output coupled to a clock input of the sixth flip flop.

18. The memory system of claim 15, wherein, in response to assertion of the third indicator, the memory is configured to be isolated from its control input circuitry for read/write access and the memory is configured to be powered by the backup power supply instead of the core power supply.

19. The memory system of claim 15, wherein the first threshold represents a voltage level below which logic will be non-functional, the second threshold represents a voltage level below which logic will not meet critical timing requirements, and the third threshold represents a voltage level below which the memory enters standby mode and is powered by the backup power supply rather than the core power supply, and wherein the third threshold is between the first and second thresholds.

20. The memory of claim 16, wherein the power sequence detection circuitry is configured to provide a standby test result based on the first test result, the second test result, and a brown out indicator, wherein the first test result and the second test result are used only when a brown out is not detected in an always-on domain, and the standby test result indicates fail when a brown out is detected in the always-on domain.

* * * * *